(12) United States Patent
Sekine et al.

(10) Patent No.: US 8,866,117 B2
(45) Date of Patent: Oct. 21, 2014

(54) SEMICONDUCTOR STORAGE DEVICE INCLUDING A DIODE AND A VARIABLE RESISTANCE ELEMENT

(75) Inventors: Katsuyuki Sekine, Yokkaichi (JP); Yasuhiro Nojiri, Yokohama (JP); Hiroyuki Fukumizu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 70 days.

(21) Appl. No.: 13/601,040

(22) Filed: Aug. 31, 2012

(65) Prior Publication Data
US 2013/0234096 A1 Sep. 12, 2013

(30) Foreign Application Priority Data
Jan. 13, 2012 (JP) ................................. 2012-005508

(51) Int. Cl.
| | |
|---|---|
| H01L 29/02 | (2006.01) |
| H01L 47/00 | (2006.01) |
| G11C 11/00 | (2006.01) |
| H01L 45/00 | (2006.01) |
| H01L 27/24 | (2006.01) |

(52) U.S. Cl.
CPC ............... *H01L 45/04* (2013.01); *H01L 45/12* (2013.01); *H01L 45/16* (2013.01); *H01L 27/2409* (2013.01); *H01L 45/1233* (2013.01); *H01L 45/146* (2013.01); *H04L 27/2463* (2013.01)
USPC ................ 257/2; 257/536; 438/382; 365/163

(58) Field of Classification Search
None
See application file for complete search history.

(56) References Cited

U.S. PATENT DOCUMENTS

| | | | | | |
|---|---|---|---|---|---|
| 5,159,430 | A | * | 10/1992 | Manning et al. | ............... 257/381 |
| 7,576,350 | B2 | * | 8/2009 | Lowrey et al. | ..................... 257/2 |
| 2008/0029754 | A1 | * | 2/2008 | Min et al. | ............................ 257/4 |
| 2008/0258129 | A1 | | 10/2008 | Toda | |
| 2010/0258781 | A1 | | 10/2010 | Phatak et al. | |
| 2010/0258782 | A1 | | 10/2010 | Kuse et al. | |
| 2011/0068314 | A1 | | 3/2011 | Takahashi et al. | |
| 2011/0070713 | A1 | | 3/2011 | Nansei | |
| 2011/0227026 | A1 | * | 9/2011 | Sekar et al. | ........................ 257/4 |

FOREIGN PATENT DOCUMENTS

| | | |
|---|---|---|
| JP | 2005-522045 | 7/2005 |
| JP | 2011-29462 | 2/2011 |
| JP | 2011-60896 | 3/2011 |
| JP | 2011-71167 | 4/2011 |
| JP | 2011-71226 | 4/2011 |

OTHER PUBLICATIONS

U.S. Appl. No. 13/778,762, filed Feb. 27, 2013, Fukumizu, et al.

* cited by examiner

*Primary Examiner* — Andres Munoz
(74) *Attorney, Agent, or Firm* — Oblon, Spivak, McClelland, Maier & Neustadt, L.L.P.

(57) ABSTRACT

A diode layer includes a first impurity semiconductor layer that includes a first impurity acting as an acceptor and a second impurity semiconductor layer that includes a second impurity acting as a donor. One end of a first electrode layer contacts the diode layer. One end of a polysilicon layer contacts the other end of the first electrode layer. One end of a variable resistance layer contacts the other end of the polysilicon layer and is able to change a resistance value. A second electrode layer contacts the other end of the variable resistance layer. At least one of a first area and a second area contains a third impurity. The first area includes one end of the polysilicon layer, the second area includes the other end of the polysilicon layer. The third impurity differs from the first impurity and the second impurity.

12 Claims, 4 Drawing Sheets

SEMICONDUCTOR STORAGE DEVICE INCLUDING A DIODE AND A VARIABLE RESISTANCE ELEMENT

CROSS-REFERENCE TO RELATED APPLICATIONS

This application is based upon and claims the benefit of priority from the prior Japanese Patent Application No. 2012-5508, filed on Jan. 13, 2012, the entire contents of which are incorporated herein by reference.

FIELD

Embodiments described herein relate to a semiconductor storage device and a manufacturing method the same.

BACKGROUND

Nowadays, electrically rewritable resistance variation memories, such as an ReRAM and a PRAM, attract attention as a semiconductor storage device. The resistance variation memory is configured to be able to change a resistance value, and data is stored in the resistance variation memory by the change of the resistance value. In the resistance variation memory, there is a need for a technology of reducing a drive voltage to suppress a fault or reliability degradation of a memory.

DETAILED DESCRIPTION

A semiconductor storage device according to an embodiment includes a diode layer, a first electrode layer, a polysilicon layer, a variable resistance layer, and a second electrode layer. The diode layer includes a first impurity semiconductor layer and a second impurity semiconductor layer. The first impurity semiconductor layer contains a first impurity acting as an acceptor. The second impurity semiconductor layer contains a second impurity acting as a donor. The first electrode layer has one end contacting the diode layer. The polysilicon layer has one end contacting the other end of the first electrode layer. The variable resistance layer has one end contacting the other end of the polysilicon layer and is able to change a resistance value. The second electrode layer contacts the other end of the variable resistance layer. At least one of a first area and a second area contains a third impurity. The first area includes one end of the polysilicon layer. The second area includes the other end of the polysilicon layer. The third impurity is different from the first impurity and the second impurity.

Hereinafter, a semiconductor storage device according to an embodiment will be described with reference to the drawings.

First Embodiment

Configuration

Figure 1:
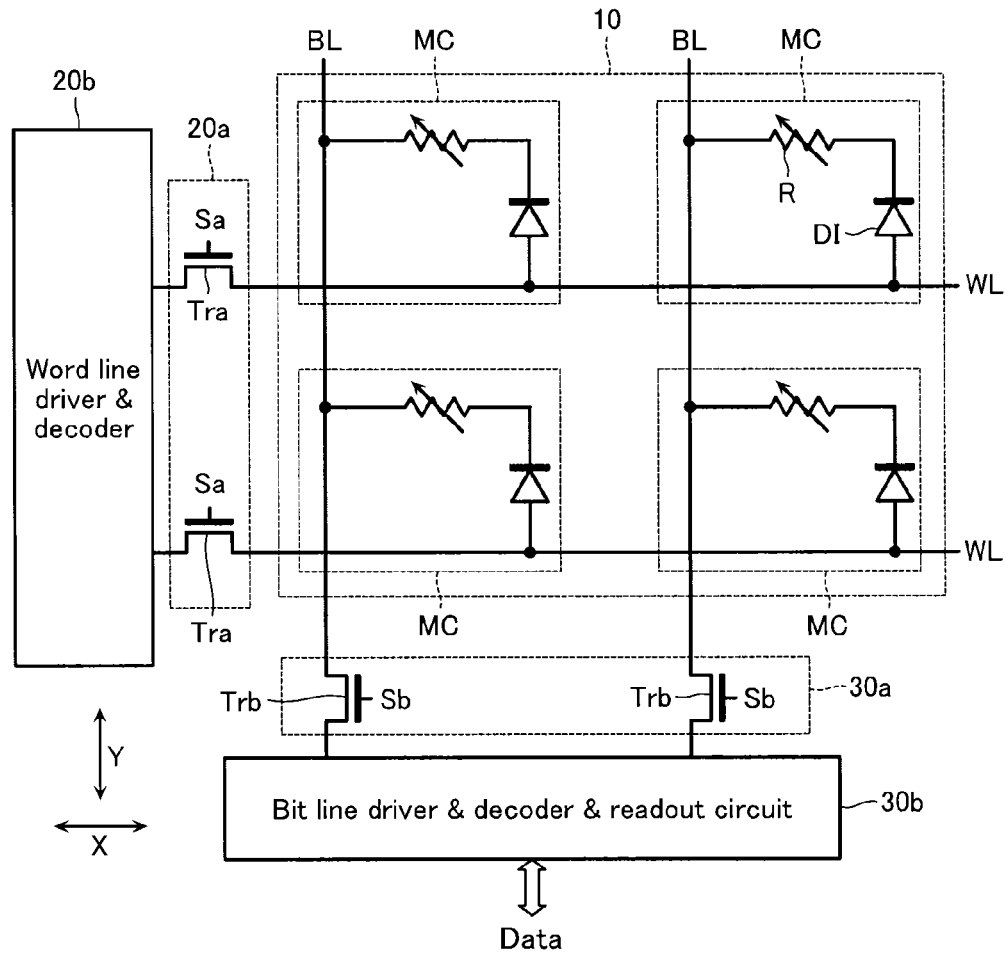
FIG. 1 is a circuit diagram of a semiconductor storage device according to a first embodiment.

A circuit configuration of a semiconductor storage device according to a first embodiment will be described below with reference to FIG. 1. Referring to FIG. 1, the semiconductor storage device of the first embodiment includes a memory cell array 10, a word line selector 20a, a word line driver 20b, a bit line selector 30a, and a bit line driver 30b.

The memory cell array 10 includes word lines WL and bit lines BL, which intersect each other, and memory cells MC each of which is disposed in an intersection of the word line WL and the bit line BL as shown in FIG. 1. The word lines WL are arrayed in a Y-direction at predetermined intervals, and extend in an X-direction. The bit lined BL are arrayed in the X-direction at predetermined intervals, and extend in the Y-direction. The memory cells MC are arranged in a matrix form on a surface formed in the X-direction and the Y-direction.

The memory cell MC includes a diode DI and a variable resistance element R as shown in FIG. 1. An anode of the diode DI is connected to the word line WL, and a cathode is connected to one end of the variable resistance element R. The other end of the variable resistance element R is connected to the bit line BL.

The variable resistance element R is electrically rewritable, and stores data in a nonvolatile manner based on a resistance value. For example, the variable resistance element R becomes a low-resistance state (set state) when a voltage is applied to the diode DI in a forward bias direction, and the variable resistance element R becomes a high-resistance state (reset state) when the voltage is applied to the diode DI in a reverse bias direction. An operation to change the resistance value of the variable resistance element R to the high-resistance state and the low-resistance state is referred to as a switch operation.

The resistance value of the variable resistance element R is not changed immediately after production. Therefore, generally a forming operation is performed such that a predetermined voltage is applied to the variable resistance element R immediately after the production to put the variable resistance element R in a resistance variable state.

The word line selector 20a includes plural selection transistors Tra as shown in FIG. 1. One end of the selection transistor Tra is connected to one end of the word line WL, and the other end of the selection transistor Tra is connected to the word line driver 20b. A signal Sa is supplied to a gate of the selection transistor Tra. That is, the word line selector 20a controls the signal Sa to selectively connect the word line WL to the word line driver 20b.

The word line driver 20b applies voltages, which are necessary to erase the data from the memory cell MC, write the data in the memory cell MC, and read the data from the memory cell MC, to the word line WL as shown in FIG. 1.

The bit line selector 30a includes plural selection transistors Trb as shown in FIG. 1. One end of the selection transistor Trb is connected to one end of the bit line BL, and the other end of the selection transistor Trb is connected to the bit line driver 30b. A signal Sb is supplied to the gate of the selection transistor Trb. That is, the bit line selector 30a controls the signal Sb to selectively connect the bit line BL to the bit line driver 30b.

The bit line driver 30b applies the voltages, which are necessary to erase the data from the memory cell MC, write the data in the memory cell MC, and read the data from the memory cell MC, to the bit line BL as shown in FIG. 1. The bit line driver 30b externally outputs the data read from the bit line BL.

Figure 2:
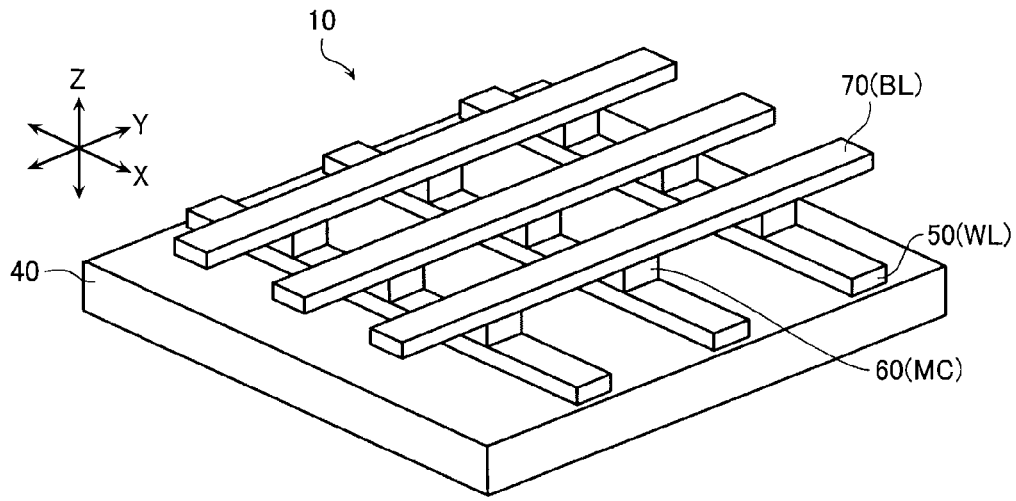
FIG. 2 is a schematic perspective view of a memory cell array 10 of the first embodiment.

A stacked structure of the memory cell array 10 of the first embodiment will be described below with reference to FIG. 2. Referring to FIG. 2, the memory cell array 10 is formed on an upper layer of a substrate 40. The memory cell array 10 includes a first conductive layer 50, a memory layer 60, and a second conductive layer 70 from a lower layer toward the upper layer. The first conductive layer 50 acts as the word line WL. The memory layer 60 acts as the memory cell MC. The second conductive layer 70 acts as the bit line BL.

The first conductive layers 50 are formed into a stripe shape extending in the X-direction while arrayed in the Y-direction at predetermined intervals as shown in FIG. 2. Desirably the first conductive layer 50 is made of a material having a heat-resistant property and a low resistance value. For example, the first conductive layer 50 is made of tungsten (W), titanium (Ti), tantalum (Ta), a nitride thereof, or a stacked structure thereof.

The memory layers 60 are provided on the first conductive layers 50, and arranged in a matrix form in the X-direction and the Y-direction as shown in FIG. 2.

The second conductive layers 70 are formed into the stripe shape extending in the Y-direction while arrayed in the X-direction at predetermined intervals as shown in FIG. 2. The second conductive layer 70 is formed so as to contact an upper surface of the memory layer 60. Desirably the second conductive layer 70 is made of a material having the heat-resistant property and the low resistance value. For example, the second conductive layer 70 is made of tungsten (W), titanium (Ti), tantalum (Ta), a nitride thereof, or a stacked structure thereof.

Figure 3:
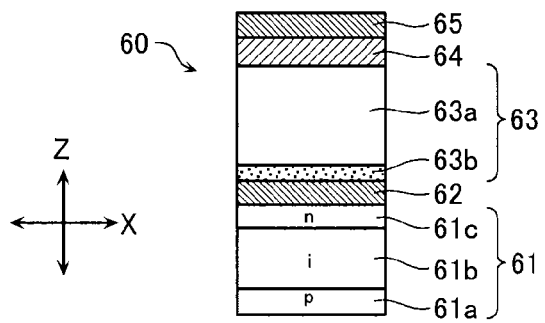
FIG. 3 is a sectional view of a memory layer 60 of the first embodiment.

The detailed stacked structure of the memory layer 60 will be described below with reference to FIG. 3. FIG. 3 is a sectional view illustrating the memory layer 60. Referring to FIG. 3, the memory layer 60 includes a diode layer 61, a lower electrode layer 62, a polysilicon layer 63, a variable resistance layer 64, and an upper electrode layer 65 from the lower layer toward the upper layer.

The diode layer 61 acts as the diode DI. The diode layer 61 is made of polysilicon.

The lower electrode layer 62 is formed on an upper surface of the diode layer 61. The lower electrode layer 62 is made of metals, such as titanium (Ti), zirconium (Zr), hafnium (Hf), tantalum (Ta), tungsten (W), aluminum (Al), silicon (Si), ruthenium (Ru), iridium (Ir), and platinum (Pt), an alloy thereof, or metal silicide.

The polysilicon layer 63 is formed on an upper surface of the lower electrode layer 62. The polysilicon layer 63 is made of polysilicon.

The variable resistance layer 64 is formed on an upper surface of the polysilicon layer 63. The variable resistance layer 64 acts as the variable resistance element R, and changes electric resistivity according to the applied voltage. For example, the variable resistance layer 64 is made of a metal oxide.

The upper electrode layer 65 is formed on an upper surface of the variable resistance layer 64. The lower electrode layer 65 is made of metals, such as titanium (Ti), zirconium (Zr), hafnium (Hf), tantalum (Ta), tungsten (W), aluminum (Al), silicon (Si), ruthenium (Ru), iridium (Ir), and platinum (Pt), an alloy thereof, or metal silicide.

The detailed diode layer 61 will be described below. As illustrated in FIG. 3, the diode layer 61 has a PIN structure ($P^+$ poly-silicon-Intrinsic-$N^+$ poly-silicon). That is, the diode layer 61 includes a P-type semiconductor layer 61a, an intrinsic semiconductor layer 61b, and an N-type semiconductor layer 61c from the lower layer toward the upper layer. The P-type semiconductor layer 61a contains a P-type impurity (such as boron) that acts as the acceptor. The N-type semiconductor layer 61c contains an N-type impurity (such as arsenic and phosphorus) that acts as the donor.

The detailed polysilicon layer 63 will be described below. As illustrated in FIG. 3, the polysilicon layer 63 includes areas 63a and 63b. The area 63b includes a lower surface of the polysilicon layer 63, and spreads upwardly from the lower surface to a predetermined level. The area 63a is an area except the area 63b. The area 63b contains an impurity (carbon, nitrogen, or oxygen). At this point, the carbon, the nitrogen, and the oxygen cause a crystal of the polysilicon to generate a crystal defect. Accordingly, the number of crystal defects per unit volume in the area 63b is greater than the number of crystal defects per unit volume in the diode layer 61 and the area 63a. A grain size of the polysilicon in the area 63b is smaller than a grain size of the polysilicon in the diode layer 61 and area 63a due to the crystal defect.

(Advantage)

An advantage of the first embodiment will be described below by a comparison of the first embodiment and a comparative example. A comparative example in which the area 63b has no crystal defect is considered. In the comparative example, a depletion layer is formed to the area 63b when the positive voltage is applied to the upper electrode layer 65. The voltage applied to the variable resistance layer 64 decreases effectively by a voltage drop in the depletion layer extending to the area 63b. That is, in the comparative example, it is necessary to increase a drive voltage or a drive time.

On the other hand, in the first embodiment, the crystal defect exists in the area 63b. Accordingly, when the positive voltage is applied to the upper electrode layer 65, the depletion layer spreads to an interface between the lower electrode layer 62 and the polysilicon layer 63, and an electron-hole pair is generated by the crystal defect in the area 63b, thereby suppressing the formation of the depletion layer in the area 63b. That is, in the first embodiment, compared with the comparative example, the switch operation and the forming operation of the memory cell MC can be performed by the small positive bias.

(Manufacturing Method)

A manufacturing method for producing the polysilicon layer 63 will be described below with reference to FIG. 4. The polysilicon layer 63 is produced by a low-pressure CVD method. The low-pressure CVD method can not only easily control a position in which the impurity is introduced to silicon but also thin an area where the impurity is introduced. As illustrated in reference "a" of FIG. 4, methane gas or ethylene gas is supplied at the same time as a silicon source (silane or disilane). Thereby, silicon to which carbon is introduced is generated to the area 63b. As illustrated in reference "b" of FIG. 4, the supply of methane gas or ethylene gas is stopped, and only the silicon source is continuously supplied to grow the silicon to the area 63a. As illustrated in reference "c" of FIG. 4, a heat treatment is performed to crystallize the silicon. The crystallization generates the crystal defect in the silicon in the area 63b.

Figure 4:
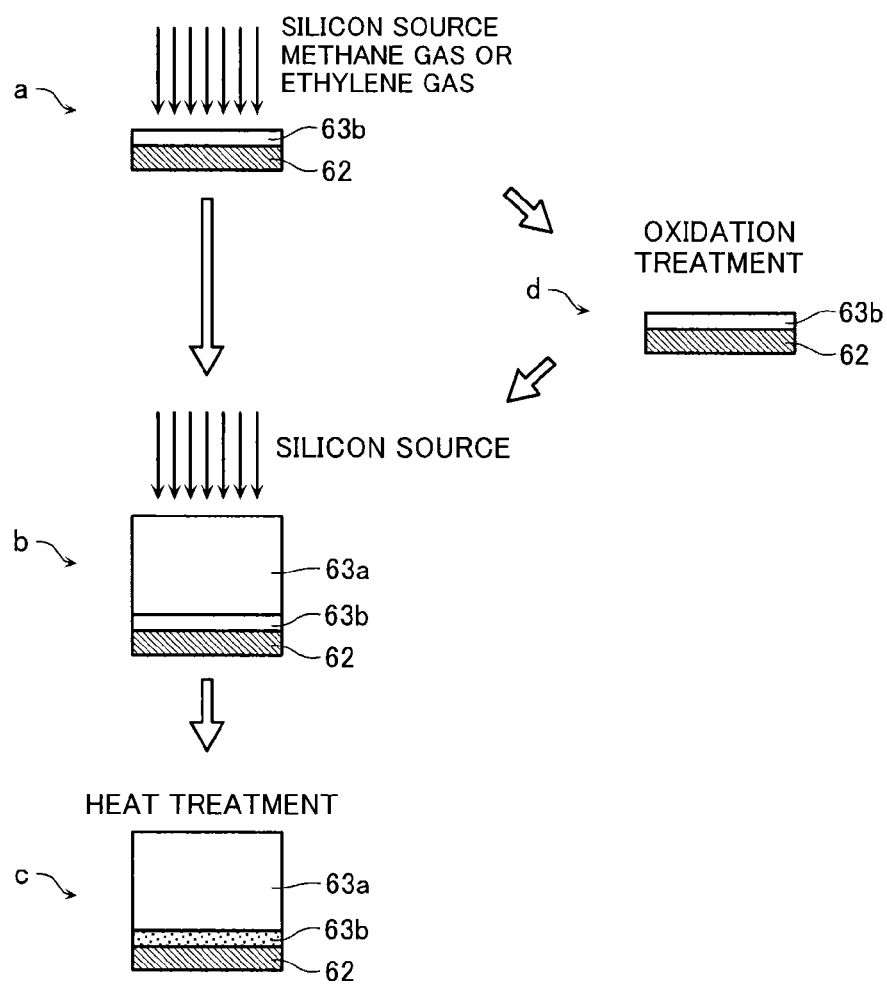
FIG. 4 is sectional view of the semiconductor storage device in a manufacturing process according to the first embodiment.

In reference "d" of FIG. 4 between "a" and "b", after the supply of silicon source and the methane or ethylene gas is stopped, an oxidant may be supplied to perform an oxidation treatment. By the oxidation treatment, the grain size of the subsequently-formed silicon decreases, and the number of grain boundaries increases compared with the case that the oxidation treatment is not performed. The increase of the grain boundary increases a generation amount of electron-hole pair, which allows the formation of the depletion layer to be suppressed.

In reference "a" of FIG. 4, when ammonia gas or hydrazine gas is supplied at the same time as the silicon source, the nitrogen can be introduced into the silicon.

Second Embodiment

A semiconductor storage device according to a second embodiment will be described below with reference to FIG. 5. The second embodiment differs from the first embodiment only in the polysilicon layer 63. In the second embodiment, because other components are identical to those of the first embodiment, the components are designated by the same numerals as those of the first embodiment, and the descriptions are not repeated here.

Figure 5:
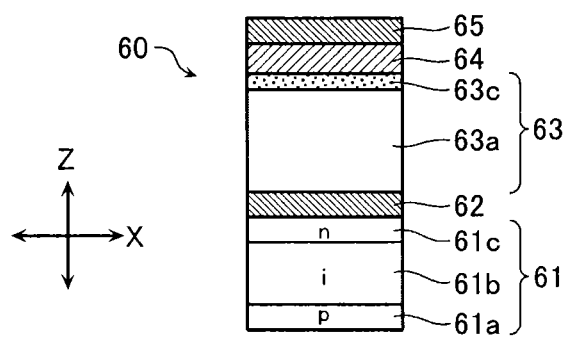
FIG. 5 is a sectional view of a memory layer 60 according to a second embodiment.

As illustrated in FIG. 5, the polysilicon layer 63 includes areas 63a and 63c. The area 63c includes the upper surface of the polysilicon layer 63, and spreads downwardly from the upper surface to a predetermined depth. The area 63a is an area except the area 63c. The area 63c contains an impurity (carbon, nitrogen, or oxygen). Accordingly, the number of crystal defects per unit volume in the area 63c is greater than the number of crystal defects per unit volume in the diode layer 61 and the area 63a. The grain size of the polysilicon in the area 63c is smaller than the grain size of the polysilicon in the diode layer 61 and area 63a due to the crystal defect.

The depletion layer generated in the memory layer 60 will be described below. When the negative voltage is applied to the upper electrode layer 65, the depletion layer spreads to the interface between the variable resistance layer 64 and the polysilicon layer 63, and the electron-hole pair is generated by the crystal defect in the area 63c. Thereby, suppressing the formation of the depletion layer in the area 63c. Therefore, in the second embodiment, the switch operation and the forming operation of the memory cell MC can be performed by the small negative bias.

Third Embodiment

A semiconductor storage device according to a third embodiment will be described below with reference to FIG. 6. The third embodiment differs from the first embodiment only in the polysilicon layer 63. In the third embodiment, because other components are identical to those of the first embodiment, the components are designated by the same numerals as those of the first embodiment, and the descriptions are not repeated here.

Figure 6:
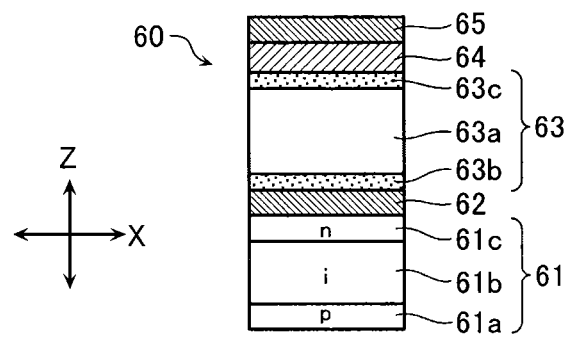
FIG. 6 is a sectional view of a memory layer 60 according to a third embodiment.

As illustrated in FIG. 6, similarly to the first embodiment and the second embodiment, the polysilicon layer 63 includes the areas 63b and 63c. In the third embodiment, it is assumed that an area except the areas 63b and 63c is the area 63a. According to the third embodiment, the switch operation and the forming operation of the memory cell MC can be performed by the small positive or negative bias.

Fourth Embodiment

A semiconductor storage device according to a fourth embodiment will be described below with reference to FIG. 7. The fourth embodiment differs from the first embodiment only in the polysilicon layer 63. In the fourth embodiment, because other components are identical to those of the first embodiment, the components are designated by the same numerals as those of the first embodiment, and the descriptions are not repeated here.

Figure 7:
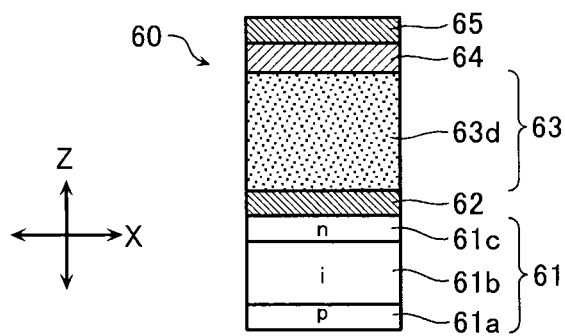
FIG. 7 is a sectional view of a memory layer 60 according to a fourth embodiment.

As illustrated in FIG. 7, the polysilicon layer 63 includes an area 63d. The area 63d ranges from a lower end to an upper end of the polysilicon layer 63. The area 63d includes an impurity (carbon, nitrogen, or oxygen). Accordingly, the number of crystal defects per unit volume in the area 63d is greater than the number of crystal defects per unit volume in the diode layer 61. The grain size of the polysilicon in the area 63d is smaller than the grain size of the polysilicon in the diode layer 61. According to the fourth embodiment, the switch operation and the forming operation of the memory cell MC can be performed by the small positive or negative bias similarly to the third embodiment.

According to the fourth embodiment, the impurity is hardly activated in the polysilicon to increase the resistance of the polysilicon layer 63. Accordingly, the polysilicon layer 63 acts as a protective resistance to be able to suppress a passage of a transient current through the memory cell MC, and the forming operation and the switch operation can stably be performed. Further, in the fourth embodiment, the polysilicon layer 63 that acts as the protective resistance is adjacent to the variable resistance layer 64, so that the transient current can largely be suppressed.

Fifth Embodiment

A semiconductor storage device according to a fifth embodiment will be described below with reference to FIG. 8. The fifth embodiment differs from the first embodiment only in the polysilicon layer 63. In the fifth embodiment, because other components are identical to those of the first embodiment, the components are designated by the same numerals as those of the first embodiment, and the descriptions are not repeated here.

Figure 8:
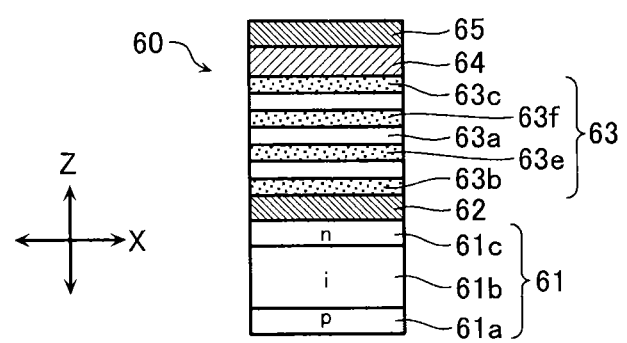
FIG. 8 is a sectional view of a memory layer 60 according to a fifth embodiment.

As illustrated in FIG. 8, in addition to the same areas 63b and 63c as the third embodiment, the polysilicon layer 63 includes areas 63e and 63f, which are disposed in a Z-direction with a predetermined distance while extending in the X- and Y-directions. In the fifth embodiment, it is assumed that an area except the areas 63b, 63c, 63e, and 63f is the area 63a. The areas 63e and 63f include an impurity (carbon, nitrogen, or oxygen). Accordingly, the number of crystal defects per unit volume in the areas 63e and 63f is greater than the number of crystal defects per unit volume in the diode layer 61 and the area 63a. The grain size of the polysilicon in the areas 63e and 63f is smaller than the grain size of the polysilicon in the diode layer 61 and area 63a. In the fifth embodiment, similarly to the third embodiment, the switch operation and the forming operation of the memory cell MC can be performed by the small positive or negative bias.

Sixth Embodiment

A semiconductor storage device according to a sixth embodiment will be described below with reference to FIG. 9. The sixth embodiment differs from the first embodiment only in the polysilicon layer 63. In the sixth embodiment, because other components are identical to those of the first embodiment, the components are designated by the same numerals as those of the first embodiment, and the descriptions are not repeated here.

Figure 9:
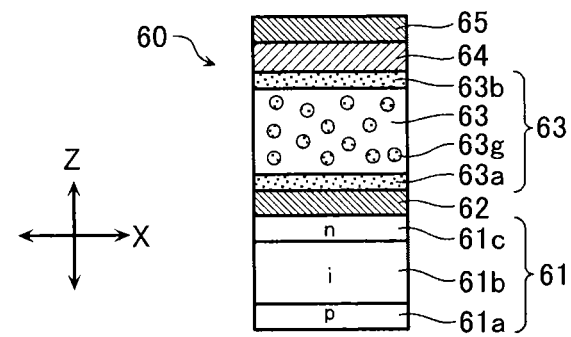
FIG. 9 is a sectional view of a memory layer 60 according to a sixth embodiment.

As illustrated in FIG. 9, in addition to the same areas 63b and 63c as the third embodiment, the polysilicon layer 63 includes plural areas 63g that are discretely located in the X-, Y-, and Z-directions. In the sixth embodiment, it is assumed that an area except the areas 63b, 63c, and 63g is the area 63a. The area 63g contains an impurity (carbon, nitrogen, or oxygen). Accordingly, the number of crystal defects per unit volume in the area 63g is greater than the number of crystal defects per unit volume in the diode layer 61 and the area 63a. The grain size of the polysilicon in the area 63g is smaller than the grain size of the polysilicon in the diode layer 61 and area 63a. In the sixth embodiment, similarly to the third embodiment, the switch operation and the forming operation of the memory cell MC can be performed by the small positive or negative bias.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, a metal may be used as the impurity in the areas 63b to 63g instead of the carbon, the nitrogen, and the oxygen. In this case, an organic metal gas is blown under a low-pressure atmosphere after the silicon is formed by the low-pressure CVD method. When the silicon is formed again, the polysilicon containing the metallic impurity is formed. However, because possibly the metal reacts with the polysilicon to form silicide, desirably the carbon, the nitrogen, and the oxygen are used as the impurity in the areas 63b to 63g compared with the metal. Desirably the nitrogen is used as the impurity in the areas 63b to 63g compared with the carbon. This is because the silicon containing the nitrogen is higher than the silicon containing the carbon in oxidation resistance. That is, in the polysilicon layer 63 made of the silicon containing the nitrogen, the oxidation is suppressed in the production process compared with the polysilicon layer made of the silicon containing the carbon, and a large amount of cell current can pass while a diameter of the memory cell MC is kept constant.

The impurity may be introduced into the areas 63b to 63g by ion implantation. In this case, after the ion implantation of the impurity is performed to the polysilicon deposited by the low-pressure CVD method, the heat treatment is performed to crystallize the polysilicon. The impurity may be introduced into the areas 63b to 63g by a PVD method using single-crystal silicon as a target.

What is claimed is:

1. A semiconductor storage device comprising:
    a diode layer comprising a first impurity semiconductor layer and a second impurity semiconductor layer, the first impurity semiconductor layer containing a first impurity configured to act as an acceptor, the second impurity semiconductor layer containing a second impurity configured to act as a donor;
    a first electrode layer having a first end contacting the diode layer;
    a polysilicon layer having a first end contacting a second end of the first electrode layer and having a grain size smaller than a grain size of the diode layer;
    a variable resistance layer having a first end contacting a second end of the polysilicon layer, and configured to change a resistance value; and
    a second electrode layer contacting a second end of the variable resistance layer,
    at least one of a first area and a second area containing a third impurity, the first area including the first end of the polysilicon layer, the second area including the second end of the polysilicon layer,
    the third impurity being different from the first impurity and the second impurity.

2. The semiconductor storage device according to claim 1, wherein the third impurity is configured to cause the polysilicon layer to generate a crystal defect.

3. The semiconductor storage device according to claim 1, wherein the third impurity is one of carbon, nitrogen, or oxygen.

4. The semiconductor storage device according to claim 1, wherein the third impurity is a metal.

5. The semiconductor storage device according to claim 1, wherein a third area that ranges from the first end to the second end of the polysilicon layer contains the third impurity.

6. The semiconductor storage device according to claim 1, wherein
    the diode layer, the first electrode layer, the polysilicon layer, the variable resistance layer, and the second electrode layer are stacked in a stacking direction,
    the first area is provided at a first electrode side of the polysilicon layer, and
    the first area contains the third impurity.

7. The semiconductor storage device according to claim 1, wherein
    the diode layer, the first electrode layer, the polysilicon layer, the variable resistance layer, and the second electrode layer are stacked in a stacking direction,
    the second area is provided at a variable resistance layer side of the polysilicon layer, and
    the second area contains the third impurity.

8. The semiconductor storage device according to claim 1, wherein
    the diode layer, the first electrode layer, the polysilicon layer, the variable resistance layer, and the second electrode layer are stacked in a stacking direction,
    the first area is provided at a first electrode side of the polysilicon layer,
    the second area is provided at a variable resistance layer side of the polysilicon layer, and
    both the first area and the second area contain the third impurity.

9. The semiconductor storage device according to claim 1, wherein
    the diode layer, the first electrode layer, the polysilicon layer, the variable resistance layer, and the second electrode layer are stacked in a stacking direction, and
    fourth areas located in the polysilicon layer contain the third impurity, the fourth areas being disposed in the stacking direction with a predetermined distance while spreading in a direction orthogonal to the stacking direction.

10. The semiconductor storage device according to claim 1, wherein
    the diode layer, the first electrode layer, the polysilicon layer, the variable resistance layer, and the second electrode layer are stacked in a stacking direction, and fifth areas located in the polysilicon layer contain the third impurity, the fifth areas being discretely disposed in the stacking direction and a direction orthogonal to the stacking direction.

11. The semiconductor storage device according to claim 1, further comprising:
a first conductive layer extending in a first direction; and
a second conductive layer extending in a second direction,
wherein the diode layer, the first electrode layer, the polysilicon layer, the variable resistance layer, and the second electrode layer are provided at a point where the first conductive layer and the second conductive layer intersect each other, and provided between the first conductive layer and the second conductive layer.

12. The semiconductor storage device according to claim 1, wherein
the variable resistance layer is made of a metal oxide, and
the first electrode layer and the second electrode layer are made of any of a metal, an alloy, and a metal silicide.

* * * * *